(12) United States Patent
Yoshida

(10) Patent No.: US 6,476,641 B2
(45) Date of Patent: Nov. 5, 2002

(54) LOW POWER CONSUMING CIRCUIT

(75) Inventor: Kousuke Yoshida, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/898,979

(22) Filed: Jul. 3, 2001

(65) Prior Publication Data

US 2001/0050379 A1 Dec. 13, 2001

(30) Foreign Application Priority Data

Jul. 3, 2000 (JP) ......................................... 2000-200643

(51) Int. Cl.[7] ............................. H03K 19/094; G05F 1/10
(52) U.S. Cl. ............................. 326/83; 326/121; 326/33; 326/17; 327/544
(58) Field of Search ........................... 326/121, 83, 17, 326/33, 81, 36; 327/544, 545, 546, 534, 537

(56) References Cited

U.S. PATENT DOCUMENTS 5,583,457 A * 12/1996 Horiguchi et al. .......... 326/121
5,815,029 A * 9/1998 Matsumoto ................. 327/546

FOREIGN PATENT DOCUMENTS

JP          9-55470      2/1997
JP          2000-13215   1/2000

* cited by examiner

Primary Examiner—Daniel D. Chang
(74) Attorney, Agent, or Firm—Choate, Hall & Stewart

(57) ABSTRACT

A low power consuming circuit is provided which is capable of reducing power consumption by using a Vt (threshold voltage) characteristic of a MIS (Metal Insulator Semiconductor) transistor for generating a source voltage. N-channel transistors making up an inverter is configured by being stacked vertically. An N-channel transistor source voltage control circuit controls voltages so that a gate voltage of an N-channel transistor source voltage bias transistor existing in a lower state is transferred to a drain voltage terminal of the N-channel transistor source voltage bias transistor or to a supply voltage terminal.

15 Claims, 6 Drawing Sheets

FIG. 4 *(PRIOR ART)*
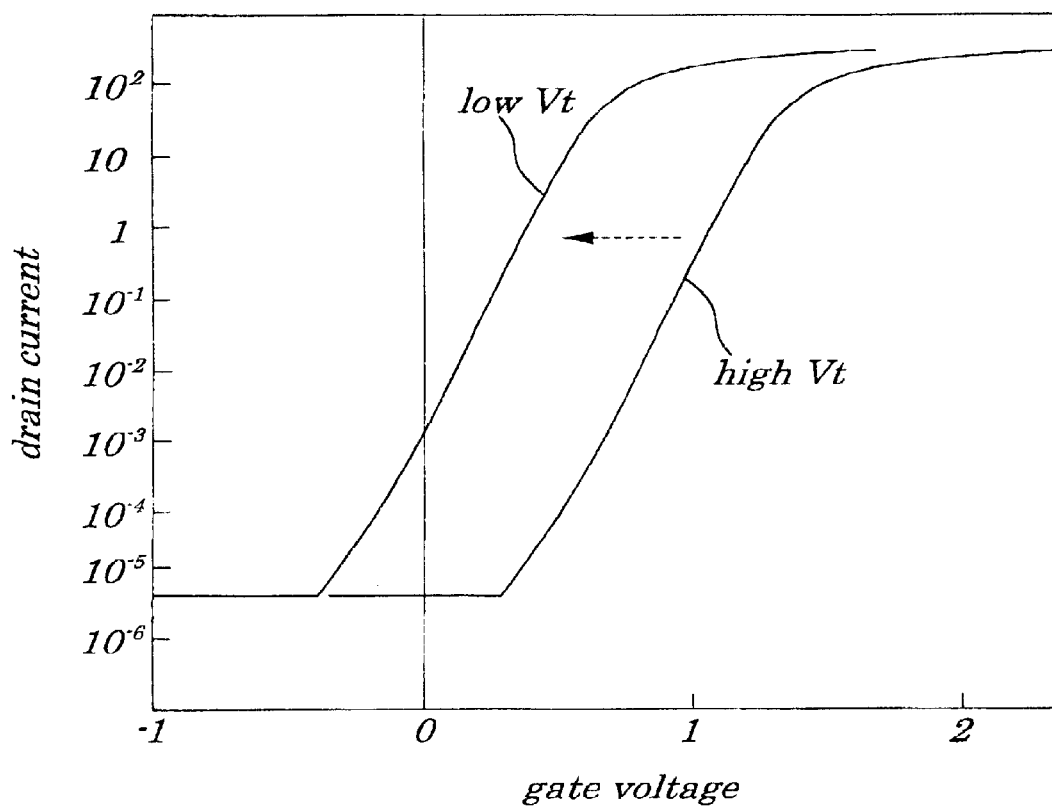

FIG.5 *(PRIOR ART)*
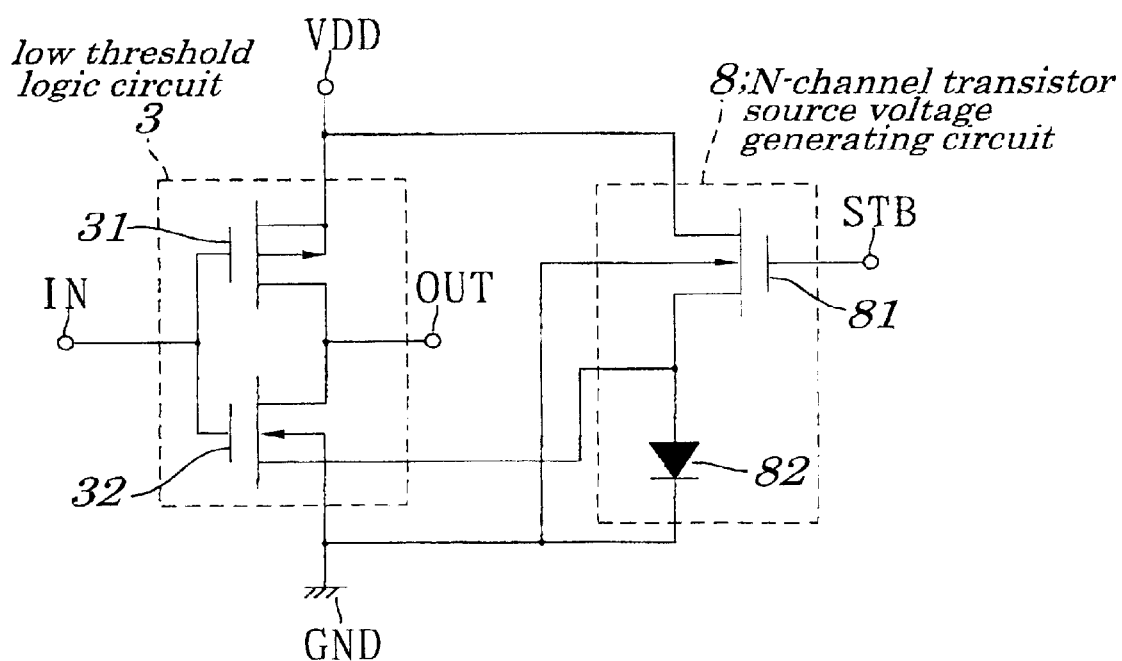

FIG.6 *(PRIOR ART)*
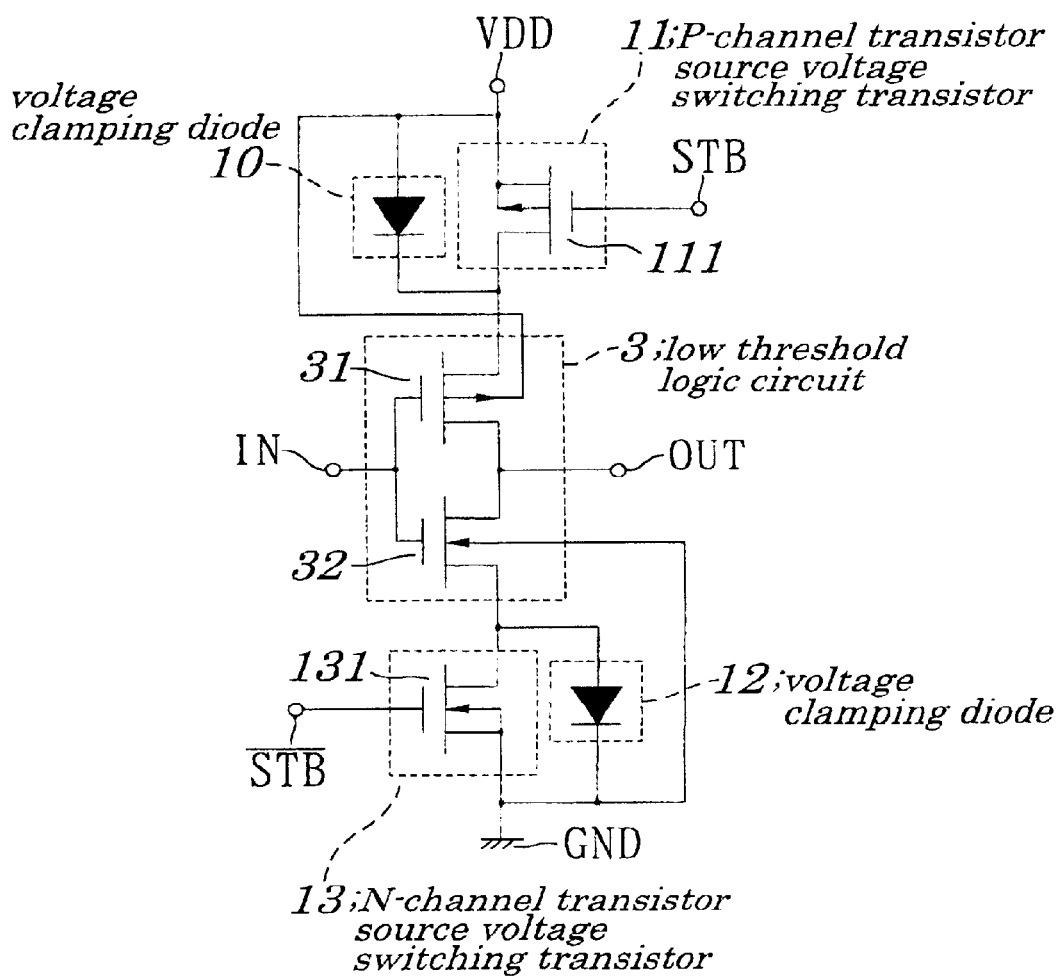

LOW POWER CONSUMING CIRCUIT

BACKGROUND OF THE INVENTION

1. Field of the Invention

The present invention relates to a semiconductor integrated circuit made up of a CMIS (Complementary Metal Insulator Semiconductor) providing a low threshold voltage and more particularly to a low power consuming circuit enabling reduction in power consumption during standby (that is, while in a standby mode).

The present application claims priority of Japanese Patent Application No. 2000-200643 filed on Jul. 3, 2000, which is hereby incorporated by reference.

2. Description of the Related Art

As is well known in this technical field, a layer-stacked structure made up of a metal, an insulator (thin insulating film), and a semiconductor, with the insulator interposed between the metal and the semiconductor, is called a "MIS" structure. A MIS-type field effect transistor using a silicon oxide film as the insulator is called a MOS (Metal Oxide Semiconductor) field effect transistor. Hereinafter the field effect transistor is referred to as an FET or simply as a transistor. The MIS transistor provides a threshold voltage (hereinafter referred to simply as a "Vt").

By causing the Vt to be lowered, even when a low voltage is supplied, the MIS transistor can be operated at a high speed. However, as shown in FIG. 4, it is known that, if the Vt in the MIS transistor is lowered, when an enhancement type MIS transistor is turned OFF (that is, when the gate voltage is 0V), sub-threshold leakage currents between a drain and a source are increased. For example, when a thickness of an oxide film is 60 Å and a temperature is 85° C., every time the Vt is decreased by 100 mV, drain current increases by ten times.

On the other hand, if the Vt is increased, a junction leakage current (being dependent on drain voltage) between the drain and a back gate becomes predominant as the transistor drains leakage current, causing the transistor to be saturated.

Moreover, if a supply voltage is lowered, the junction leakage current is decreased, however, if the supply voltage is lowered without changing dimensions of the transistor, operation speed of the transistor decreases. To increase the operation speed with the supply voltage being lowered, an increase in size of the transistor is required. However, when the transistor is increased in size, since a parasitic capacitance is increased, the operation speed is not always made high unconditionally.

Therefore, reducing of a thickness of a gate oxide film or lowering of the Vt is effective for operating the transistor at high speed even while a low voltage is supplied without increasing the transistor in size. However, to reduce the leakage current, it is necessary to make the Vt high. Because of this, conditions for the Vt to achieve high operations at the time of supply of low voltages and simultaneously to lower power consumption are mutually exclusive.

To solve this problem, a method is proposed in which power consumption is lowered as a whole and high speed operations are assured by switching between a high speed operation mode (active mode) and a low power consumption mode (standby mode) in terms of time. To implement this, technology in which the Vt can be changed in terms of time is required.

FIG. 5 is a diagram showing a conventional low power consuming circuit. The low power consuming circuit shown in FIG. 5 includes a low threshold logic circuit 3 and an N-channel transistor source voltage generating circuit 8.

As shown in FIG. 5, the low threshold logic circuit 3 is a CMIS standard inverter circuit made up of a P-channel MIS transistor 31 and an N-channel MIS transistor 32. A gate of the P-channel MIS transistor 31 is connected to a gate of the N-channel MIS transistor 32. A drain of the P-channel MIS transistor 31 is connected to a drain of the N-channel MIS transistor 32. The gates of the P-channel MIS transistor 31 and of the N-channel MIS transistor 32 are connected to an input terminal "IN" and their drains are connected to an output terminal "OUT". A back gate and a source of the P-channel MIS transistor 31 are connected to each other and the source of the P-channel MIS transistor 31 is connected to a power source terminal VDD. A source of the N-channel MIS transistor 32 is connected to a grounding terminal GND and a back gate of the N-channel MIS transistor 32 is connected to the grounding terminal GND. The power source terminal VDD is also called a maximum power source and the grounding terminal GND is also called a minimum power source.

On the other hand, the N-channel transistor source voltage generating circuit 8 is made up of an N-channel MIS transistor 81 and a diode 82. The N-channel MIS transistor 81 acts as a switch N-channel transistor. A drain of the N-channel MIS transistor 81 is connected to the power source terminal VDD and its back gate is connected to the grounding terminal GND. A gate of the N-channel MIS transistor 81 is connected to a control terminal STB. A source of the N-channel MIS transistor 81 is connected to an anode of the diode 82. A cathode of the diode 82 is connected to the grounding terminal GND.

The source of the N-channel MIS transistor 32 in the low threshold logic circuit 3 is connected to the anode of the diode 82 in the N-channel transistor source voltage generating circuit 8 and to the source of the N-channel MIS transistor 81.

Another related art is also known. For example, a "semiconductor integrated circuit" is disclosed in Japanese Patent Application Laid-open No. 2000-13215 (hereinafter referred to as a "prior art 1") in which a leakage current during standby in a logic circuit including a low threshold complementary type FET can be reduced by using simple configurations of the logic circuit and, at the same time, a potential at each node is still maintained during standby. In the prior art 1, switching of two kinds of source voltages is implemented by connecting, in parallel, a potential clamping circuit made up of a diode, a high resistance device or a transistor, and a control transistor. Moreover, in the prior art 1, the switching is implemented by switching between two modes in a configuration in which two devices are connected in parallel and in a configuration in which devices of the same kind are connected in serial.

Next, operations of a low power consuming circuit disclosed in the prior art 1 will be described by referring to FIG. 6. The low power consuming circuit in FIG. 6 includes a low threshold logic circuit 3, first voltage clamping diode (potential clamping circuit) 10, P-channel transistor source voltage switching transistor (control transistor) 11, a second voltage clamping diode (potential clamping circuit) 12, and N-channel transistor source voltage switching transistor (control transistor) 13.

As shown in FIG. 6, to a source of a P-channel MIS transistor 31 in the low threshold logic circuit 3 is connected the first voltage clamping diode 10 and the P-channel transistor source voltage switching transistor 11 in parallel so that the P-channel MIS transistor 31 is forward-biased from a power source VDD. That is, an anode of the first voltage clamping diode 10 is connected to the power source VDD and a cathode of the first voltage clamping diode 10 is connected to the source of the P-channel MIS transistor 31 in the low threshold logic circuit 3. The P-channel transistor source voltage switching transistor 11 is made up of a P-channel MIS transistor 111. A back gate and a source of the P-channel MIS transistor 111 are connected to each other and its source is connected to the power source VDD. A gate of the P-channel MIS transistor 111 is connected to a first control terminal STB and its drain is connected to the source of the P-channel MIS transistor 31 in the low threshold logic circuit 3.

On the other hand, to a source of a N-channel MIS transistor 32 in the low threshold logic circuit 3 is connected the second voltage clamping diode 12 and the N-channel transistor source voltage switching transistor 13 in parallel so that the N-channel MIS transistor 32 is forward-biased to a grounding terminal GND. An anode of the second voltage clamping diode 12 is connected to a source of the N-channel MIS transistor 32 in the low threshold logic circuit 3 and its cathode is connected to the grounding terminal GND. The N-channel transistor source voltage switching transistor 13 is made up of an N-channel MIS transistor 131. A back gate and a source of the N-channel MIS transistor 131 are connected to each other and its source is connected to the grounding terminal GND. A gate of the n-channel MIS transistor 131 is connected to a second control terminal $\overline{STB}$ and its drain is connected to a source of the N-channel MIS transistor 32 in the low threshold logic circuit 3. While in a standby mode, a logically high signal is supplied to the first control terminal STB and a logically low signal is supplied to the second control terminal $\overline{STB}$. In this case, the P-channel MIS transistor 111 in the P-channel transistor source voltage switching transistor 11 is turned OFF and the N-channel MIS transistor 131 in the N-channel transistor source voltage switching transistor 13 is also turned OFF.

On the other hand, while in an active mode, a logically low signal is supplied to the first control terminal STB and a logically high signal is supplied to the second control terminal $\overline{STB}$. In this case, the P-channel MIS transistor 111 in the P-channel transistor source voltage switching transistor 11 is turned ON and the N-channel MIS transistor 131 in the N-channel transistor source voltage switching transistor 13 is turned ON.

Thus, during standby, a voltage which is clamped on a source voltage by a built-in voltage in the diode is used as a source voltage to be used for the P-channel MIS transistor 31 and the N-channel MIS transistor 32 in the low threshold logic circuit 3. This can be implemented by flowing a current by the potential clamping diodes 10 and 12 with each of the P-channel transistor source voltage switching transistor 11 and the N-channel transistor source voltage switching transistor 13 being turned OFF. Ordinarily, by flowing a current through the respective switching transistors 11 and 13 by causing each of the P-channel transistor source voltage switching transistor 11 and the N-channel transistor source voltage switching transistor 13 to be turned ON, the source voltage of the P-channel MIS transistor 31 and the N-channel MIS transistor 32 in the low threshold logic circuit 3 is caused to be at the same potential as each of the power sources VDD, GND. The same effects can be obtained by employing configurations using a high resistance device or a transistor instead of the first voltage clamping diode 10.

A "semiconductor circuit and semiconductor circuit apparatus" is disclosed in Japanese Patent Application Laid-open No. Hei 9- 55470 (hereinafter referred to as a "prior art 2") in which a leakage current in a MOSFET whose threshold voltage has been lowered to be operated at a low voltage during standby can be reduced. In the prior art 2, a reduction of leakage voltage is also implemented by switching modes between two potentials. That is, the semiconductor circuit disclosed in the prior art 2 is the semiconductor circuit having the MOSFET and is provided with two voltage clamping units used to clamp two different potentials to be applied as a source potential to the MOSFET and with a switching unit used to switch the source of the MOSFET to any one of the voltage clamping units.

However, each of the above conventional technologies, the prior art 1 and the prior art 2 have the following problem. That is, the conventional low power consuming circuit shown in FIG. 5, while the N-channel MIS transistor 81 is ON, continues to flow currents between the maximum power source terminal VDD and the minimum power source grounding terminal GND. This causes the Vt of the N-channel MIS transistor 32 in the low threshold logic circuit 3 to increase, thus enabling the leakage current in the low threshold logic circuit 3 to be reduced. However, it is impossible to reduce the leakage current as a whole in the conventional low power consuming circuit. The reason is because an intermediate potential is generated using a partial voltage divided by on-resistance of the N-channel MIS transistor 81 and by forward resistance of the diode 82.

On the other hand, in configurations described in the prior art 1 (in FIG. 6), diodes (in which no parasitic circuit is formed with the power source VDD by the anode and the cathode) or potential clamping circuits 10 and 12 such as high resistance devices or a like, which are connected in parallel, are required. To fabricate these components, additional processes are necessary. In the case of the diode in particular, to prevent the formation of the parasitic circuit, a large area for a substrate is required except for an SOI (Silicon On Insulator) substrate. The reason is because, in the standard CMIS manufacturing process, since high resistance devices cannot be fabricated, exclusive additional processes are required. Moreover, in the case of the diode, since forward biasing operations are performed, NPN or PNP bipolar operations are easily induced and a malfunction, latch-up or a like occurs, thus making it impossible to lay out devices in the periphery of the diode. On the other hand, if the substrate is the SOI substrate, though the parasitic circuit can be neglected, there is a shortcoming that the substrate is costly. When the transistors are used as potential clamping circuits, since a temporary power source is made unstable when the operation resistance itself is small, power consumption is made large. Moreover, since one of the clamping circuits is not used depending on mode, layout area is made larger. In any case, in the prior art 1, in addition to the control transistors 11 and 13, additional potential clamping circuits 10 and 12 are made necessary.

In the case of the prior art 2 described above, no description is provided about how to generate the intermediate potential and no knowledge can not be obtained about how power is consumed at the time of generating the intermediate potential.

SUMMARY OF THE INVENTION

In view of the above, it is an object of the present invention to provide a low power consuming circuit capable of reducing power consumption while in a standby mode without increasing a layout area.

According to a first aspect of the present invention, there is provided a low power consuming circuit provided with:

a logic circuit containing, at least one inverter made up of a P-channel metal insulator semiconductor transistor and an N-channel metal insulator semiconductor transistor, both gates of which are connected to each other and both drains of which are connected to each other, and operating in an active mode and in a standby mode; and wherein a sub-threshold leakage current is reduced by boosting, in the standby mode, a threshold voltage in the P-channel and the N-channel metal insulator semiconductor transistors in the logic circuit by using a back gate bias effect induced by a source voltage control; and wherein a circuit to increase a source voltage used to boost the threshold voltage is made up of a source voltage control circuit having a complementary metal insulator semiconductor transistor and a source voltage bias transistor having a metal insulator semiconductor transistor whose gate is connected to a drain of the source voltage control circuit while in the standby mode.

In the foregoing first aspect, a preferable mode is one that wherein is made up of only metal insulator semiconductor transistors.

Also, a preferable mode is one wherein, in the logic circuit, a source of the N-channel metal insulator semiconductor transistor connected to a minimum power source is connected to a variable minimum potential line.

Also, a preferable mode is one wherein the source voltage bias transistor is made up of an N-channel metal insulator semiconductor transistor whose gate is able to be switched to either of a maximum power source or the drain of the source voltage control circuit.

Also, a preferable mode is one wherein the transistor source voltage control circuit is made up of an N-channel transistor source voltage control circuit which operates to connect the gate of the source voltage bias transistor to the maximum power source while in the active mode, and the gate of the source voltage bias transistor to a drain of the N-channel transistor source voltage control circuit while in the standby mode.

Also, a preferable mode is one wherein the N-channel transistor source voltage control circuit is made up of the P-channel metal insulator semiconductor transistor whose back gate and source are connected to each other, whose source is also connected to the maximum power source, whose the gate is connected to a control terminal and whose drain is connected to the gate of the second metal insulator semiconductor transistor and of the N-channel metal insulator semiconductor transistor whose gate is connected to the control terminal, whose drain is connected to the second metal insulator semiconductor transistor, whose gate is connected to the minimum power source and whose source is connected to the variable minimum potential line.

Also, a preferable mode is one wherein the logic circuit is made up of a complementary metal insulator semiconductor standard inverter circuit.

Furthermore, a preferable mode is one wherein the logic circuit is made up of a static random access memory.

Still furthermore, a preferable mode is one wherein a circuit having an active standby mode function and a circuit having no the active standby mode function are formed on a same chip.

According to a second aspect of the present invention, there is provided a low power consuming circuit provided with:

a logic circuit containing, at least one inverter made up of a P-channel metal insulator semiconductor transistor and an N-channel metal insulator semiconductor transistor, both gates of which are connected to each other and both drains of which are connected to each other, and operating in an active mode and in a standby mode; and wherein a sub-threshold leakage current is reduced by boosting, in the standby mode, a threshold voltage in the P-channel and the N-channel metal insulator semiconductor transistors in the logic circuit by using a back gate bias effect induced by a source voltage control;

wherein a circuit to increase a source voltage used to boost the threshold voltage is made up of an N-channel source voltage control circuit having a complementary metal insulator semiconductor transistor, a P-channel source voltage control circuit having a complementary metal insulator semiconductor transistor, a first source voltage bias transistor having an N-channel metal insulator semiconductor transistors and a second source voltage bias transistor having a P-channel metal insulator semiconductor transistors;

wherein, in the logic circuit, a source of the N-channel metal insulator semiconductor transistor to be connected to a minimum power source is connected to a variable minimum potential line and a source of the P-channel metal insulator semiconductor transistor to be connected to a maximum power source in the logic circuit is connected to a variable maximum potential line;

wherein a gate of the first source voltage bias transistor is able to be switched to either of the maximum power source or a drain of the N-channel source voltage control circuit; and wherein a gate of the P-channel metal insulator semiconductor transistor is able to be switched to either of the minimum power source or a drain of the P-channel source voltage control circuit.

In the foregoing second aspect, a preferable mode is one wherein the N-channel transistor source voltage control circuit operates to connect a gate of the first source voltage bias transistor to the maximum power source while in the active mode, and the gate of the first source voltage bias transistor to the drain of the N-channel source voltage control circuit while in the standby mode; and wherein the P-channel transistor source voltage control circuit operates to connect a gate of the second source voltage bias transistor to the minimum power source while in the active mode, and the gate of the second source voltage bias transistor to the drain of the P-channel source voltage control circuit while in the standby mode.

Also, a preferable mode is one wherein the N-channel transistor source voltage control circuit includes;

a P-channel metal insulator semiconductor transistor whose back gate and source are connected to each other, whose the source is also connected to the maximum power source, whose gate is connected to a first control terminal and whose drain is connected to the first source voltage bias transistor gate; and an N-channel metal insulator semiconductor transistor whose gate is connected to the first control terminal, whose drain is connected to the first source voltage bias transistor, whose gate is connected to the minimum power source and whose source is connected to the variable minimum potential line, and wherein the P-channel transistor source voltage control circuit includes:

an N-channel MIS transistor whose back gate and source are connected to each other, whose the source is also connected to the minimum power source, whose gate is connected to a second control terminal and whose drain is connected to a gate of the second source voltage bias transistor; and a P-channel MIS transistor whose gate is connected to the second control terminal, whose drain is connected to the second source voltage bias transistor, whose gate is connected to the maximum power source and whose source is connected to the variable maximum potential line.

With the above configurations, the circuit required to boost the source voltage in order to increase the threshold voltage is fabricated by using the MIS transistor whose gate and drain are connected while in the standby mode and the above low power consuming circuit is configured only by the CMIS circuit, therefore, the power consumption during standby can be reduced without increasing layout area.

With another configuration, the intermediate potential generating circuit is configured, with low power consumption, by using the drain voltage (obtained by connecting its terminal so as to be at the same potential as the gate potential) of an enhancement type MIS transistor, that is, by using an ON/OFF characteristic of the transistor induced by the drain current characteristic. Therefore, the Vt of the MIS transistor can be controlled by applying an intermediate potential produced by an intermediate potential generating circuit to the source voltage. Thus, the low power consuming circuit can be implemented by constructing the CMIS circuit using the MIS transistor that can change the characteristic so that the high Vt with little sub-threshold leakage currents can be obtained even if the Vt of the MIS transistor is low.

BRIEF DESCRIPTION OF THE DRAWINGS

The above and other objects, advantages, and features of the present invention will be more apparent from the following description taken in conjunction with the accompanying drawings in which:

FIG. 4 is a diagram of characteristics showing a relation of a gate voltage to a drain current occurring when a threshold voltage (Vt) is used as a parameter;

FIG. 5 is a diagram showing a conventional low power consuming circuit; and

FIG. 6 is a circuit diagram showing configurations of a low power consuming circuit disclosed in Japanese Patent Application Laid-open No. 2000-13215 (Prior Art 1).

DETAILED DESCRIPTION OF THE PREFERRED EMBODIMENTS

Best modes of carrying out the present invention will be described in further detail using various embodiments with reference to the accompanying drawings.

First Embodiment

Figure 1:
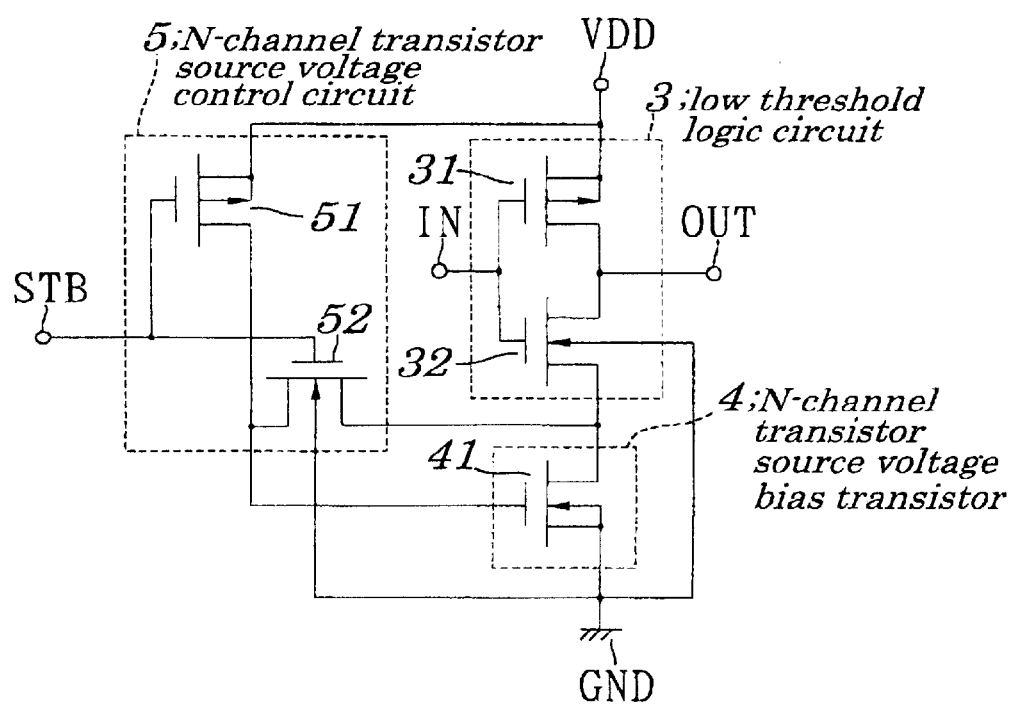
FIG. 1 is a circuit diagram showing configurations of a low power consuming circuit according to a first embodiment of the present invention.

FIG. 1 is a circuit diagram showing configurations of a low power consuming circuit according to a first embodiment of the present invention. FIG. 1 shows an example of the low power consuming circuit in which a Vt controlled circuit is used as a CMIS standard inverter circuit for a low threshold logic circuit 3.

The low threshold logic circuit 3 is made up of a P-channel MIS transistor 31 and an N-channel MIS transistor 32. A gate of the P-channel MIS transistor 31 is connected to a gate of the N-channel MIS transistor 32. A drain of the P-channel MIS transistor 31 is connected to a drain of the N-channel MIS transistor 32. The gates of the P-channel MIS transistor 31 and of the N-channel MIS transistor 32 are connected to an input terminal "IN" and the drains of the P-channel MIS transistor 31 and of the N-channel MIS transistor 32 are connected to an output terminal "OUT".

A back gate and a source of the P-channel MIS transistor 31 are connected to each other and the source of the P-channel MIS transistor 31 is connected to a power source terminal VDD to which a supply voltage is applied. On the other hand, a back gate of the N-channel MIS transistor 32 is connected to a grounding terminal GND having a grounding potential.

A power source terminal VDD is called a maximum power source and a grounding terminal GND is called a minimum power source. The supply voltage (power source potential) is called a maximum potential and the grounding potential is called a minimum potential. The low power consuming circuit of the first embodiment has an N-channel transistor source voltage bias transistor 4 and an N-channel transistor source voltage control circuit 5.

The N-channel transistor source voltage bias transistor 4 is made up of an N-channel MIS transistor 41. A drain of the N-channel MIS transistor 41 is connected to a source of the N-channel MIS transistor 32 in the low threshold logic circuit 3. A back gate and a source of the N-channel MIS transistor 41 are connected to each other and the source of the N-channel MIS transistor 41 is connected to the grounding terminal GND.

A line containing a point connecting the source of the N-channel MIS transistor 32 in the low threshold logic circuit 3 to the drain of the N-channel MIS transistor 41 in the N-channel transistor source voltage bias transistor 4 is called a "variable minimum potential line".

On the other hand, the N-channel transistor source voltage control circuit 5 is made up of a P-channel MIS transistor 51 and an N-channel MIS transistor 52. A back gate and a source of the P-channel MIS transistor 51 are connected to each other and the source of the P-channel MIS transistor 51 is connected to the power source terminal VDD. The gate of the P-channel MIS transistor 51 is connected to a control terminal STB. A drain of the P-channel MIS transistor 51 is connected to a drain of the N-channel MIS transistor 52. A source of the N-channel MIS transistor 52 is connected to the source of the N-channel MIS transistor 32 in the low threshold logic circuit 3 and to the drain of the N-channel MIS transistor 41 of the N-channel transistor source voltage bias transistor 4. That is, the source of the N-channel MIS transistor 52 is connected to the variable minimum potential line. A back gate of theN-channel MIS transistor 52 is connected to the grounding terminal GND. A gate of the N-channel MIS transistor 52 is connected to the control terminal STB.

In the embodiment, the N-channel transistors making up the inverter are stacked vertically. The N-channel transistor source voltage control circuit 5 operates to control voltages so that the gate voltage in the N-channel transistor source voltage bias transistor 4 existing in a stage being lower than the N-channel transistor source voltage control circuit 5 is transferred to a terminal of either of a drain voltage of the N-channel transistor source voltage bias transistor 4 or a supply power.

While in a standby mode, a logically high signal is supplied to the control terminal STB. At this point, the P-channel MIS transistor 51 in the N-channel transistor source voltage control circuit 5 is turned OFF and the N-channel MIS transistor 52 is turned ON. While in an active mode, a logically low signal is supplied to the control terminal STB. At this point, the P-channel MIS transistor 51 in the N-channel transistor source voltage control circuit 5 is turned ON and the N-channel MIS transistor 52 is turned OFF.

While in the standby mode, by supplying the gate voltage of the N-channel transistor source voltage bias transistor 4 to its drain terminal to make equal voltages at its gate and drain, a voltage being equivalent to the Vt is generated at the drain terminal of the N-channel MIS transistor 32 in the low threshold logic circuit 3. This causes the N-channel MIS Transistor of the inverter circuit to receive a back gate bias and the Vt to be increased, thus enabling sub-threshold leakage currents to be reduced more than in standard mode. As a result, only logically low signal is supplied to the input terminal "IN" and, only when the N-channel MIS transistor 32 is OFF, leakage currents of the circuit can be reduced. Therefore, configurations of the embodiment of the present invention are effective in reducing leakage currents in CMIS circuits having many N-channel transistors.

Moreover, while in the active mode, the gate potential of the N-channel transistor source voltage bias transistor 4 is boosted to be at a supply power potential and drain potential of the N-channel transistor source voltage bias transistor 4 is lowered to be a ground potential. This causes the Vt to be lowered to a normal level, thus enabling high speed operations.

In the low power consuming circuit shown in FIG. 5, since a circuit flowing a feedthrough current ordinarily at the time of the generation of the intermediate potential is not used, it is possible to construct a circuit in which there is little leakage current during standby.

When the Vt of the MIS transistor is decreased to achieve high operations, the sub-threshold leakage current flows between the drain and the source, causing the increase in power consumption. Therefore, in the embodiment of the present invention, by boosting the source voltage using the back gate voltage, the Vt in the internal circuit is increased, thereby decreasing the sub-threshold leakage current between the drain and the source. This enables the leakage current in the circuit to be reduced during standby.

Since a source voltage control circuit, in general, requires a feedthrough current, its power consumption is large. Therefore, according to the embodiment of the present invention, by using a characteristic of the Vt of the MIS transistor when the source voltage is generated, the power consumption can be reduced.

Second Embodiment

Figure 2:
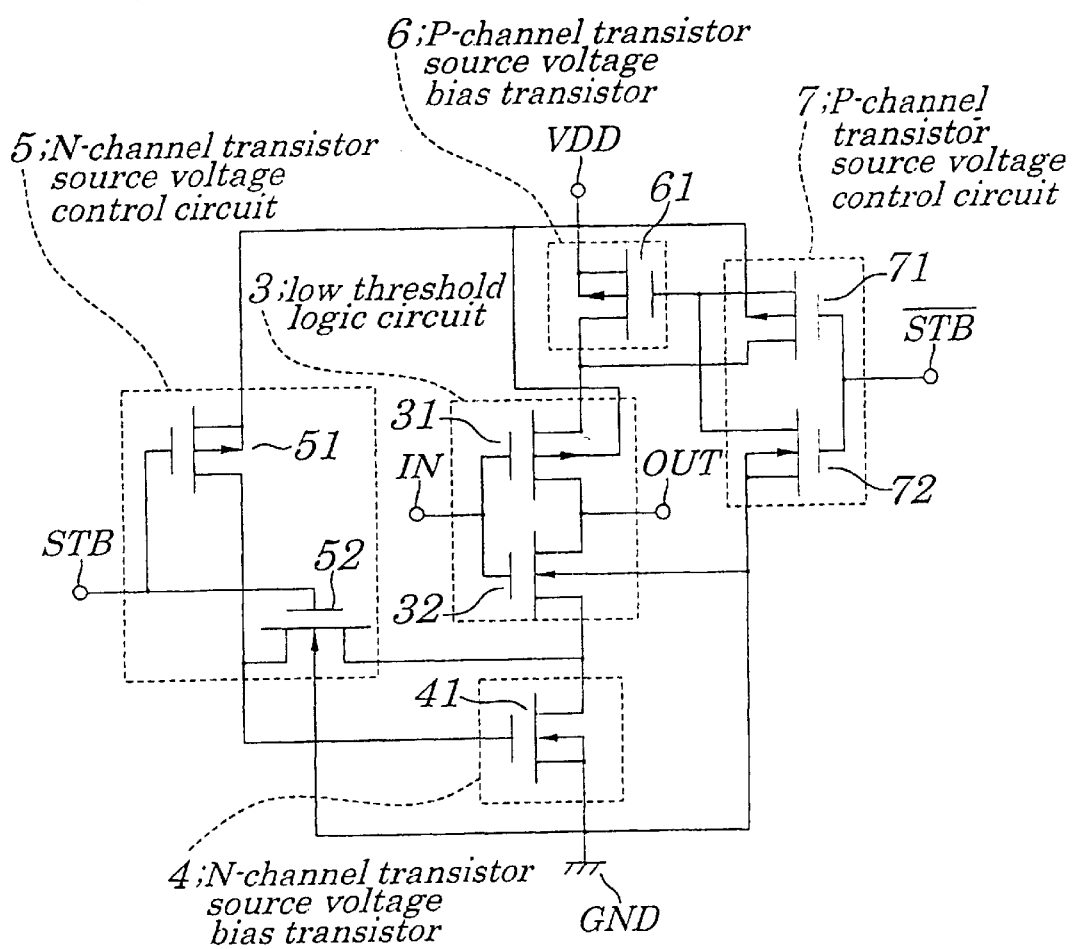
FIG. 2 is a circuit diagram showing configurations of a low power consuming circuit according to a second embodiment of the present invention.

Configurations and operations of a low power consuming circuit of a second embodiment of the present invention will be described by referring to FIG. 2. In the low power consuming circuit of the second embodiment, as in the case of the first embodiment, a Vt controlled circuit is used as a CMIS standard inverter circuit in a low threshold logic circuit 3. The low power consuming circuit in FIG. 2 differs from those in FIG. 1 in that it further has a P-channel transistor source voltage bias transistor 6 and a P-channel transistor source voltage control circuit 7 and additionally another control circuit $\overline{\text{STB}}$ being connected to the P-channel transistor source voltage control circuit 7. Here, a control terminal STB is called a first control terminal STB and the control terminal $\overline{\text{STB}}$ is called a second control terminal $\overline{\text{STB}}$. Hereinafter, to avoid duplicated descriptions, only configurations being different from those in FIG. 1 will be described.

The P-channel transistor source voltage bias transistor 6 is made up of a P-channel MIS transistor 61. A back gate and a source of the P-channel MIS transistor 61 are connected to each other and the source of the P-channel MIS transistor 61 is connected to a power source terminal VDD. A drain of the P-channel MIS transistor 61 is connected to a drain of the P-channel MIS transistor 31 in the low threshold logic circuit 3. A back gate of the P-channel MIS transistor 31 in the low threshold logic circuit 3 is connected to the power source terminal VDD.

A line containing a point connecting a source of the P-channel MIS transistor 32 in the low threshold logic circuit 3 to the drain of the P-channel MIS transistor 61 in the P-channel transistor source voltage bias transistor 6 is called "a variable maximum potential line".

The P-channel transistor source voltage control circuit 7 is made up of a P-channel MIS transistor 71 and an N-channel MIS transistor 72. A drain of the P-channel MIS transistor 71 is connected to a gate of a P-channel MIS transistor 61 in the P-channel transistor source voltage bias transistor 6. A back gate of the P-channel MIS transistor 71 is connected to the power source terminal VDD. A gate of the P-channel MIS transistor 71 is connected to the second control terminal $\overline{\text{STB}}$. A source of the P-channel MIS transistor 71 is connected to the source of the P-channel MIS transistor 31 in the low threshold logic circuit 3 and to the drain of the P-channel MIS transistor 61 of the P-channel transistor source voltage bias transistor 6. That is, the source of the P-channel MIS transistor 71 is connected to the variable maximum potential line. A drain of the N-channel MIS transistor 72 is connected to a gate of the P-channel MIS transistor 61 of the P-channel transistor source voltage control circuit 7. A back gate and a source of the N-channel MIS transistor 72 are connected to each other and the source of the n-channel MIS transistor 72 is connected to a grounding terminal GND. A gate of the n-channel MIS transistor 72 is connected to the second control terminal $\overline{\text{STB}}$.

In the embodiment of the present invention, the N-channel transistors making up the inverter are stacked vertically. An N-channel transistor source voltage control circuit 5 operates to control voltage so that gate voltage in an N-channel transistor source voltage bias transistor 4 existing in a stage being lower than the N-channel transistor source voltage control circuit 5 is transferred to a terminal of either of a drain voltage or a supply power of the N-channel transistor source voltage bias transistor 4.

The P-channel transistors making up the inverter are also stacked vertically. The P-channel transistor source voltage control circuit 7 operates to control voltage so that gate voltage in the P-channel transistor source voltage bias transistor 6 existing in a stage being higher than the P-channel transistor source voltage control circuit 7 is transferred to a terminal of either of a drain voltage or a supply power of the P-channel transistor source voltage bias transistor 6.

While in standby mode, a logically high signal is supplied to the first control terminal STB and a logically low signal is supplied to the second control terminal $\overline{STB}$. In this case, a P-channel MIS transistor 51 in the N-channel transistor source voltage control circuit 5 is turned OFF and an N-channel MIS transistor 52 is turned ON. The N-channel MIS transistor 72 in the P-channel transistor source voltage control circuit 7 is turned OFF and the P-channel MIS transistor 71 is turned ON.

While in active mode, a logically low signal is supplied to the first control terminal STB and a logically low signal is supplied to the second control terminal $\overline{STB}$. In this case, the P-channel MIS transistor 51 in the N-channel transistor source voltage control circuit 5 is turned ON and the N-channel MIS transistor 52 is turned OFF. The N-channel MIS transistor 72 in the P-channel transistor source voltage control circuit 7 is turned ON and the P-channel MIS transistor 71 is turned OFF.

While in the standby mode, by supplying the gate voltage of the N-channel transistor source voltage bias transistor 4 to its drain terminal to make equal voltages at its gate and drain, a voltage being equivalent to the Vt is generated at a drain terminal of the N-channel transistor source voltage bias transistor 4. At the same time, by supplying the gate voltage of the P-channel transistor source voltage bias transistor 6 to its drain terminal to make equal voltages at its gate and drain, a voltage being equivalent to the Vt is generated at a drain terminal of the P-channel transistor source voltage bias transistor 6. This causes the N-channel transistors and the P-channel transistors of the inverter circuit to be fed with a back gate bias which, at the same time, causes an increase in the Vt, thus enabling the sub-threshold leakage current to be reduced more than in standard mode. Therefore, irrespective of whether a signal to be fed to an input terminal is logically low or high, leakage currents in the circuit can be reduced.

Moreover, while in the active mode, the gate potential of the N-channel transistor source voltage bias transistor 4 is boosted to be at a supply power potential and drain potential of the N-channel transistor source voltage bias transistor 4 is lowered to be a ground potential. This causes the Vt to be lowered to a normal level, thus enabling high speed operations.

Also, in the embodiment of the present invention, since a circuit flowing a feedthrough current ordinarily at the time of the generation of the intermediate potential is not used, it is possible to construct a circuit in which there is little leakage current during standby.

When the Vt of the MIS transistor is decreased to achieve high operations, the sub-threshold leakage current flows between the drain and the source, causing increase in power consumption. Therefore, in the embodiment of the present invention, by boosting the source voltage using the back gate voltage, the Vt in the internal circuit is increased, thus decreasing the sub-threshold leakage current between the drain and the source. This enables leakage current in the circuit to be decreased during standby.

Since a source voltage control circuit, in general, requires feedthrough current, its power consumption is large. Therefore, according to the embodiment of the present invention, by using a characteristic of the Vt of the MIS transistor when source voltage is generated, power consumption can be reduced.

Third Embodiment

Figure 3:
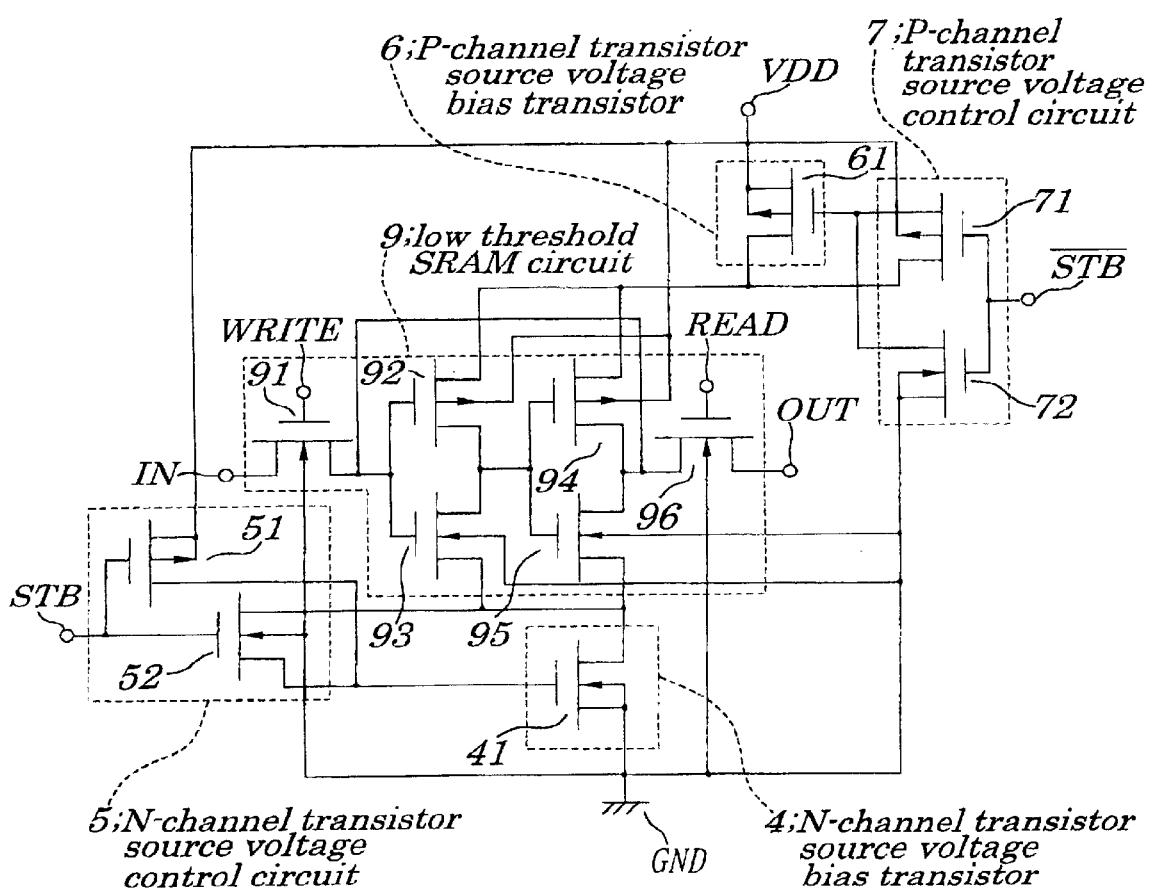
FIG. 3 is a circuit diagram showing configurations of a low power consuming circuit according to a third embodiment of the present invention.

Configurations and operations of a low power consuming circuit of a third embodiment of the present invention will be described by referring to FIG. 3. Configurations of the low power consuming circuit of the third embodiment shown in FIG. 3 are the same as those shown in FIG. 2 except that a low threshold SRAM (Static Random Access Memory) circuit 9 is used as a Vt controlled circuit instead of a low threshold circuit 3 Hereinafter, to avoid duplicated descriptions, only configurations being different from those shown in FIG. 2 will be described.

The low threshold SRAM circuit 9 of the third embodiment includes an inputting N-channel MIS transistor 91, a first P-channel MIS transistor 92, a first n-channel MIS transistor 93, a second P-channel MIS transistor 94, a second N-channel MIS transistor 95 and an outputting N-channel MIS transistor 96.

A drain of the inputting N-channel MIS transistor 91 is connected to an input terminal "IN", its gate is connected to a writing control terminal "WRITE" and its back gate is connected to a back gate of an N-channel MIS transistor 52 in an N-channel transistor source voltage control circuit 5. A source of the inputting N-channel MIS transistor 91 is connected to a gate of the first P-channel MIS transistor 92, to a gate of the first N-channel MIS transistor 93, to a drain of the second P-channel MIS transistor 94, to a drain of the second N-channel MIS transistor 95 and to a source of the outputting N-channel MIS transistor 96.

A source of the first P-channel MIS transistor 92 is connected to a source of the second P-channel MIS transistor 94, to a drain of a P-channel MIS transistor 61 in a P-channel transistor source voltage bias transistor 6 and to a source of a P-channel MIS transistor 71 of a P-channel transistor source voltage control circuit 7. A back gate of the first P-channel MIS transistor 92 is connected to a back gate of a power source terminal VDD. A drain of the first P-channel MIS transistor 92 is connected to a drain of the first N-channel MIS transistor 93, to a gate of the second P-channel MIS transistor 94 and to a gate of the second N-channel MIS transistor 95.

A back gate of the first N-channel MIS transistor 93 is connected to a grounding terminal GND, its source is connected to a source of the second N-channel MIS transistor 95, to a source of the N-channel MIS transistor 52 of the N-channel source voltage control circuit 5 and to a drain of a N-channel MIS transistor 41 in an N-channel transistor source voltage bias transistor 4.

A back gate of the second P-channel MIS transistor 94 is connected to the power source terminal VDD and a back gate of the second N-channel MIS transistor 95 is connected to the grounding terminal GND.

A drain of the outputting N-channel MIS transistor 96 is connected to an output terminal "OUT" and its gate is connected to a reading control terminal "READ" and its back gate is connected to the grounding terminal "GND".

In the embodiment, the source sides of the N-channel transistors 93 and 95 making up the inverters except the N-channel transistors 91 and 96 for the SRAM inputting and outputting are tied in a bundle and stacked vertically. The N-channel transistor source voltage control circuit 5 operates to control voltage so that gate voltage in the N-channel transistor source voltage bias transistor 4 existing in a stage being lower than the N-channel transistor source voltage control circuit 5 is transferred to a terminal of either of a drain voltage of the N-channel transistor source voltage bias transistor 4 or a supply power.

Similarly, the source sides of the P-channel transistors 92 and 94 making up the inverter are tied in a bundle and stacked vertically. The P-channel transistor source voltage control circuit 7 operates to control voltage so that gate voltage in the P-channel transistor source voltage bias transistor 6 existing in a stage being higher than the P-channel transistor source voltage control circuit 7 is transferred to a terminal of either of a drain voltage of the P-channel transistor source voltage bias transistor 6 or a supply power.

By connecting an input terminal and an output terminal of each of a pair of the inverters contained in the low threshold SRAM circuit 9 each other to form a closed loop, a state holding function is provided.

While in standby mode, by supplying the gate voltage of the N-channel transistor source voltage bias transistor 4 to its drain terminal to make equal voltages at its gate and drain, a voltage being equivalent to the Vt is generated at the drain terminal. At the same time, by supplying the gate voltage of the P-channel transistor source voltage bias transistor 6 to its drain terminal to make equal voltages at its gate and drain, a voltage being equivalent to the Vt is generated at the drain.

This causes the N-channel transistor of the inverter circuit to receive a back gate bias and the Vt to be increased, thus enabling sub-threshold leakage currents to be reduced more than in standard mode. Therefore, a logically low signal or logically high signal is supplied to the input terminal IN and, irrespective of contents of a memory, leakage current of the circuit can be reduced.

By this method, since power continues to be supplied, the content of the memory of the low threshold SRAM circuit 9 are not erased.

Moreover, while in the active mode, gate voltage of the N-channel transistor source voltage bias transistor 4 is boosted to be a supply voltage and drain voltage of the N-channel transistor source voltage bias transistor 4 is lowered to be a grounding potential. This causes voltage to be lowered to a normal Vt, thus enabling high speed operations.

In the embodiment of the present invention, since a circuit flowing a feedthrough current ordinarily at the time of generation of the intermediate potential is not used, it is possible to construct a circuit in which there is little leakage current during standby.

When the Vt of the MIS transistor is decreased to achieve high operations, the sub-threshold leakage current flows between the drain and the source, causing increase in power consumption. Therefore, the Vt in the internal circuit is increased by boosting the source voltage by the back gate voltage, thus reducing the sub-threshold leakage current between the drain and the source. This enables the leakage current in the circuit to be decreased during standby.

Since a source voltage control circuit, in general, requires a feedthrough current, its power consumption is large. Therefore, according to the embodiment of the present invention, by using a characteristic of the Vt of the MIS transistor when the source voltage is generated, the power consumption can be reduced.

It is apparent that the present invention is not limited to the above embodiments but may be changed and modified without departing from the scope and spirit of the invention. For example, the low power consuming circuit of the present invention can be suitably used for a device in which a circuit having a function of the active standby mode and a device having no such function are formed on the chip.

What is claimed is:

1. A low power consuming circuit comprising:
a logic circuit containing, at least one inverter made up of a P-channel metal insulator semiconductor transistor and an N-channel metal insulator semiconductor transistor, both gates of which are connected to each other and both drains of which are connected to each other, and operating in an active mode and in a standby mode; and wherein a sub-threshold leakage current is reduced by boosting, in said standby mode, a threshold voltage in said P-channel and said N-channel metal insulator semiconductor transistors in said logic circuit by using a back gate bias effect induced by a source voltage control; and wherein a circuit to increase a source voltage used to boost said threshold voltage is made up of a source voltage control circuit having a complementary metal insulator semiconductor transistor and a source voltage bias transistor having a metal insulator semiconductor transistor whose gate is connected to a drain of said source voltage bias while in said standby mode.

2. The low power consuming circuit according to claim 1, is made up of only metal insulator semiconductor transistors.

3. The low power consuming circuit according to claim 1, wherein, in said logic circuit, a source of said N-channel metal insulator semiconductor transistor connected to a minimum power source is connected to a variable minimum potential line.

4. The low power consuming circuit according to claim 1, wherein said source voltage bias transistor is made up of an N-channel metal insulator semiconductor transistor whose gate is able to be switched to either of a maximum power source or said drain of said source voltage bias transistor.

5. The low power consuming circuit according to claim 4, wherein said source voltage control circuit is made up of an N-channel transistor source voltage control circuit which operates to connect said gate of said source voltage bias transistor to said maximum power source while in said active mode, and said gate of said source voltage bias transistor to a drain of said source voltage bias transistor while in said standby mode.

6. The low power consuming circuit according to claim 5, wherein said N-channel transistor source voltage control circuit is made up of a said P-channel metal insulator semiconductor transistor whose back gate and source are connected to each other, whose source is also connected to said maximum power source, whose gate is connected to a control terminal and whose drain is connected to said gate of said source voltage bias transistor and of an N-channel metal insulator semiconductor transistor whose gate is connected to said control terminal, whose source is connected to said drain of source voltage bias transistor, whose back gate is connected to said minimum power source and whose drain is connected to said gate of said source voltage bias transistor.

7. The low power consuming circuit according to claim 1, wherein said logic circuit is made up of a complementary metal insulator semiconductor standard inverter circuit.

8. The low power consuming circuit according to claim 1, wherein said logic circuit is made up of a static random access memory.

9. The low power consuming circuit according to claim 1, wherein a circuit having an active standby mode function and a circuit having no said active standby mode function are formed on a same chip.

10. A low power consuming circuit comprising:
a logic circuit containing, at least one inverter made up of a P-channel metal insulator semiconductor transistor and an N-channel metal insulator semiconductor transistor, both gates of which are connected to each other and both drains of which are connected to each other, and operating in an active mode and in a standby mode; and wherein a sub-threshold leakage current is reduced by boosting, in said standby mode, a threshold voltage in said P-channel and said N-channel metal insulator semiconductor transistors in said logic circuit by using a back gate bias effect induced by a source voltage control;

wherein a circuit to increase a source voltage used to boost said threshold voltage is made up of an N-channel transistor source voltage control circuit having a complementary metal insulator semiconductor transistor, a P-channel transistor source voltage control circuit having a complementary metal insulator semiconductor transistor, a first source voltage bias transistor having an N-channel metal insulator semiconductor transistors and a second source voltage bias transistor having a P-channel metal insulator semiconductor transistors;

wherein, in said logic circuit, a source of said N-channel metal insulator semiconductor transistor to be connected to a minimum power source is connected to a variable minimum potential line and a source of said P-channel metal insulator semiconductor transistor to be connected to a maximum power source in said logic circuit is connected to a variable maximum potential line;

wherein a gate of said first source voltage bias transistor is able to be switched to either of said maximum power source or a drain of said first source voltage bias transistor; and wherein a gate of said second source voltage bias transistor is able to be switched to either of said minimum power source or a drain of said second source voltage bias transistor.

11. The low power consuming circuit according to claim 10, wherein said N-channel transistor source voltage control circuit operates to connect a gate of said first source voltage bias transistor to said maximum power source while in said active mode, and said gate of said first source voltage bias transistor to said drain of said first source voltage bias transistor while in said standby mode; and wherein said P-channel transistor source voltage control circuit operates to connect a gate of said second source voltage bias transistor to said minimum power source while in said active mode, and said gate of said second source voltage bias transistor to said drain of said second source voltage bias transistor while in said standby mode.

12. The low power consuming circuit according to claim 11, wherein said N-channel transistor source voltage control circuit comprises;

a P-channel metal insulator semiconductor transistor whose back gate and source are connected to each other, whose said source is also connected to said maximum power source, whose gate is connected to a first control terminal and whose drain is connected to said first source voltage bias transistor gate; and an N-channel metal insulator semiconductor transistor whose gate is connected to said first control terminal, whose drain is connected to said first source voltage bias transistor gate, whose back gate is connected to said minimum power source and whose source is connected to said variable minimum potential line, and wherein said P-channel transistor source voltage control circuit comprises:

an N-channel MIS transistor whose back gate and source are connected to each other, whose said source is also connected to said minimum power source, whose gate is connected to a second control terminal and whose drain is connected to a gate of said second source voltage bias transistor; and a P-channel MIS transistor whose gate is connected to said second control terminal, whose drain is connected to a gate of said second source voltage bias transistor, whose back gate is connected to said maximum power source and whose source is connected to said variable maximum potential line.

13. The low power consuming circuit according to claim 10, wherein said logic circuit is made up of a complementary metal insulator semiconductor standard inverter circuit.

14. The low power consuming circuit according to claim 10, wherein said logic circuit is made up of a static random access memory.

15. The low power consuming circuit according to claim 10, wherein a circuit having an active standby mode function and a circuit having no said active standby mode function are formed on a same chip.

* * * * *